(12) United States Patent
Yeh

(10) Patent No.: US 6,680,434 B2
(45) Date of Patent: Jan. 20, 2004

(54) TERMINAL LOCATING MEANS ASSEMBLY

(75) Inventor: Ryan Yeh, Chino Hills, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 160 days.

(21) Appl. No.: 10/037,705

(22) Filed: Dec. 29, 2001

(65) Prior Publication Data

US 2003/0123233 A1 Jul. 3, 2003

(51) Int. Cl.[7] .................................................. H02G 3/08
(52) U.S. Cl. ........................... 174/50; 174/135; 174/58; 174/64; 220/3.8; 361/832
(58) Field of Search ....................... 174/50, 58, 63, 174/64, 59, 135; 220/4.02, 3.8; 361/832, 823, 828; 439/535

(56) References Cited

U.S. PATENT DOCUMENTS

| | | | | |
|---|---|---|---|---|
| 4,796,159 A | * | 1/1989 | Miksche ..................... | 361/832 |
| 5,955,700 A | * | 9/1999 | Slipy et al. .................... | 174/50 |
| 6,369,320 B1 | * | 4/2002 | Okamoto ...................... | 174/50 |
| 6,395,980 B2 | * | 5/2002 | Iitsuka ......................... | 174/50 |
| 6,433,274 B1 | * | 8/2002 | Doss et al. .................... | 174/50 |

* cited by examiner

*Primary Examiner*—Dhiru R. Patel
(74) *Attorney, Agent, or Firm*—Wei Te Chung

(57) ABSTRACT

A locating means assembly (100) includes a housing (1) and a plurality of terminals (2). The housing has a plurality of side walls (14) and defines a plurality of passageways (13) therein. A pair of ribs (12) protrude inwardly from lower portions of two side walls in each passageway and define a pair of grooves (11). Each terminal has a planar soldering portion (21), and a pair of fins (211) extending and bending upwardly from two lateral sides of the soldering portion, respectively. The terminal is received in the housing, the pair of fins elastically engaging in the two grooves, respectively. After the housing with the terminal is picked up and placed on a printed circuit board (PCB), the terminal is soldered to the PCB, and then the housing is removed.

6 Claims, 4 Drawing Sheets

TERMINAL LOCATING MEANS ASSEMBLY

FIELD OF THE INVENTION

The present invention relates to a locating means, and more particularly to a locating means for locating conductive terminals to a printed circuit board (PCB).

BACKGROUND OF THE INVENTION

Surface mounting technology (SMT) process is widely used to solder conductive terminals to a printed circuit board (PCB). Before the soldering process, a vacuum suction device must be employed to pick and place the terminals on correct places of the PCB. When the terminals are very small and the number of the terminals is large, it is difficult to achieve a precise placement of the terminals. Some conventional terminals are provided with planar portions for vacuum suction devices to pick up. However, this results in larger profiles for the terminals.

Hence, a locating means for locating terminals on a PCB is required to overcome the disadvantage of the prior art.

BRIEF SUMMARY OF THE INVENTION

A main object, therefore, of the present invention is to provide a locating means assembly for conveniently and accurately locating conductive terminals on a printed circuit board (PCB).

A locating means assembly according to the present invention includes a housing and a plurality of terminals. The housing has a plurality of side walls and defines a plurality of passageways therein. A pair of ribs protrude inwardly from lower portions of two side walls in each passageway and define a pair of grooves. Each terminal has a planar soldering portion, and a pair of fins extending and bending upwardly from two lateral sides of the soldering portion, respectively. The terminal is received in the housing, the pair of fins elastically engaging in the two grooves, respectively. After the housing with the terminal is picked up and placed on a printed circuit board (PCB), the terminal is soldered to the PCB, and then the housing is removed. The passageways of the housing can be designed to adapt for different terminals Other objects, advantages and novel features of the invention will become more apparent from the following detailed description when taken in conjunction with the accompanying drawings.

DETAILED DESCRIPTION OF THE INVENTION

Reference will now be made in detail to a preferred embodiment of the present invention.

Figure 1:
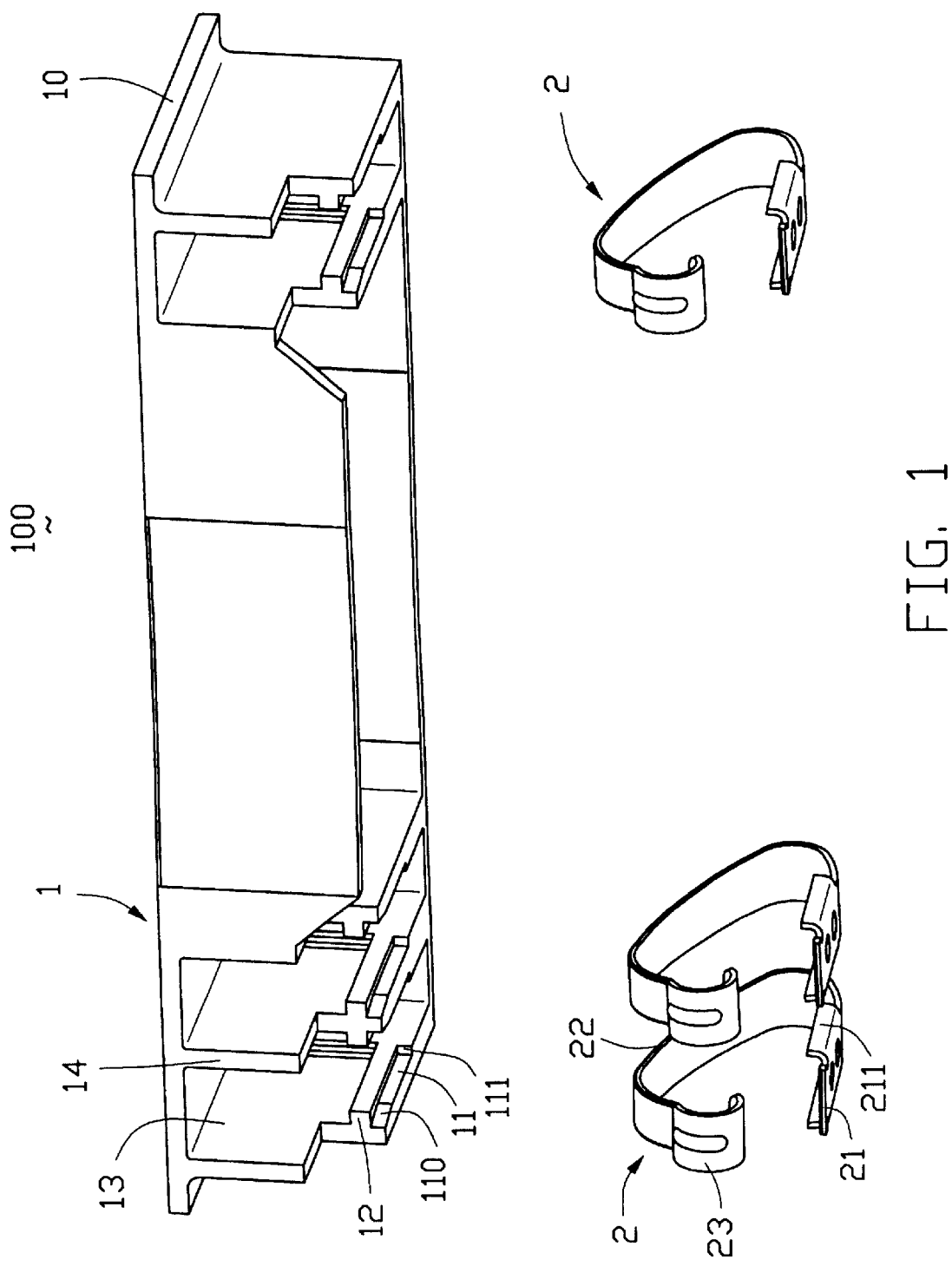
FIG. 1 is an exploded view of a locating means assembly according to the present invention.
Figure 2:
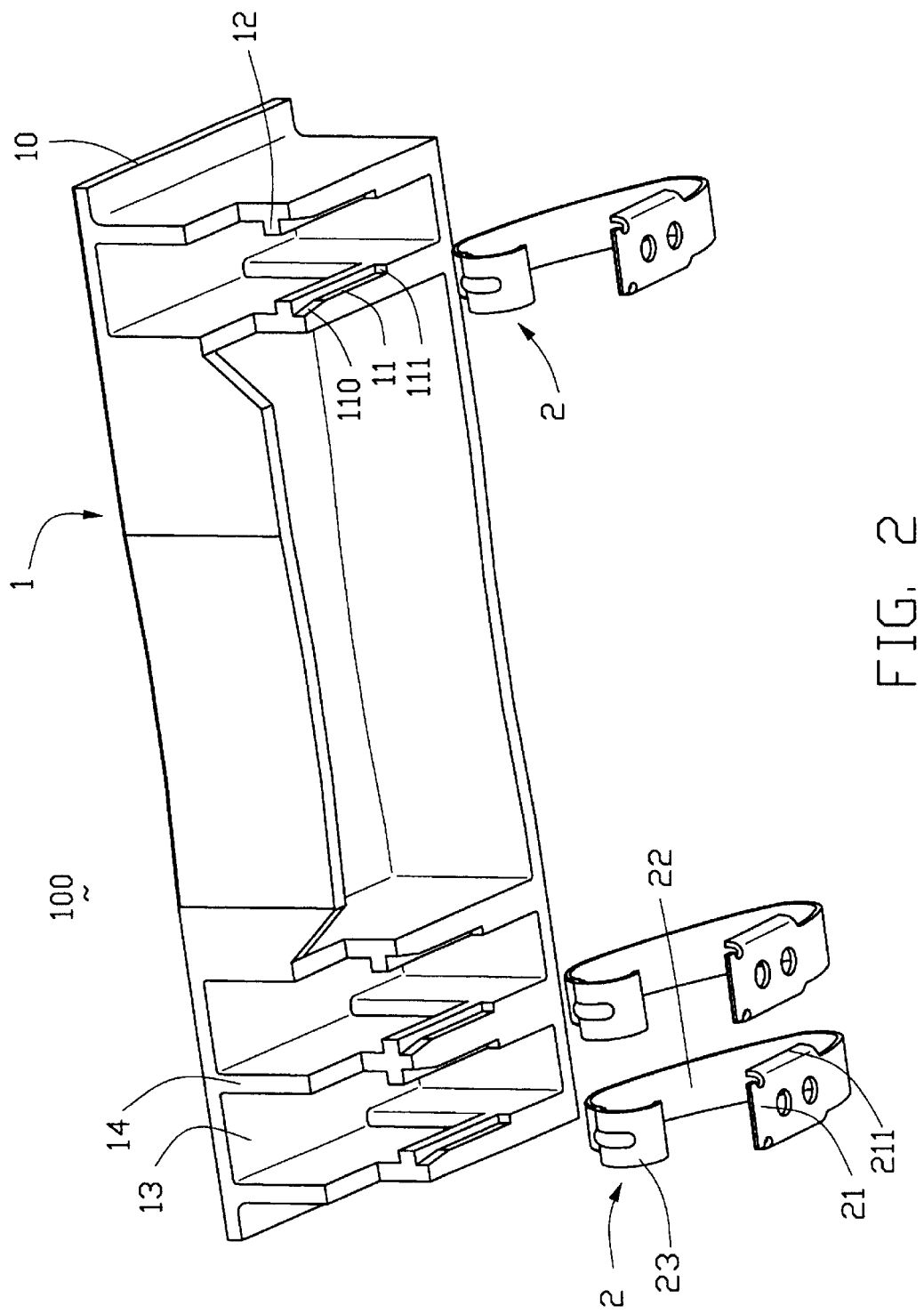
FIG. 2 is another exploded view of the locating means assembly of FIG. 1.

Referring to the drawings and particularly to FIGS. 1 and 2, a locating means assembly 100 in accordance with the present invention comprises an elongated housing 1 and a plurality of terminals 2.

The housing 1 comprises a horizontal planar top wall 10, a rear wall (not labeled) and a plurality of side walls 14 protruding downwardly from the top wall 10. The side walls 14 are parallel to each other and define a plurality of passageways 13. A pair of ribs 12 respectively protrude inwardly from lower portions of two side walls 14 in each passageways 13 and define a pair of grooves 11. An enlarged portion 110 is defined at a front end of each groove 11 and a stopping portion 111 is formed at a rear end of each groove 11.

Each terminal 2 comprises a contacting portion 23, a planar soldering portion 21 and a connecting portion 22 connecting the contacting portion 23 with the soldering portion 21. A pair of fins 211 extend and bend upwardly from two lateral sides of each soldering portion 21, respectively.

Figure 3:
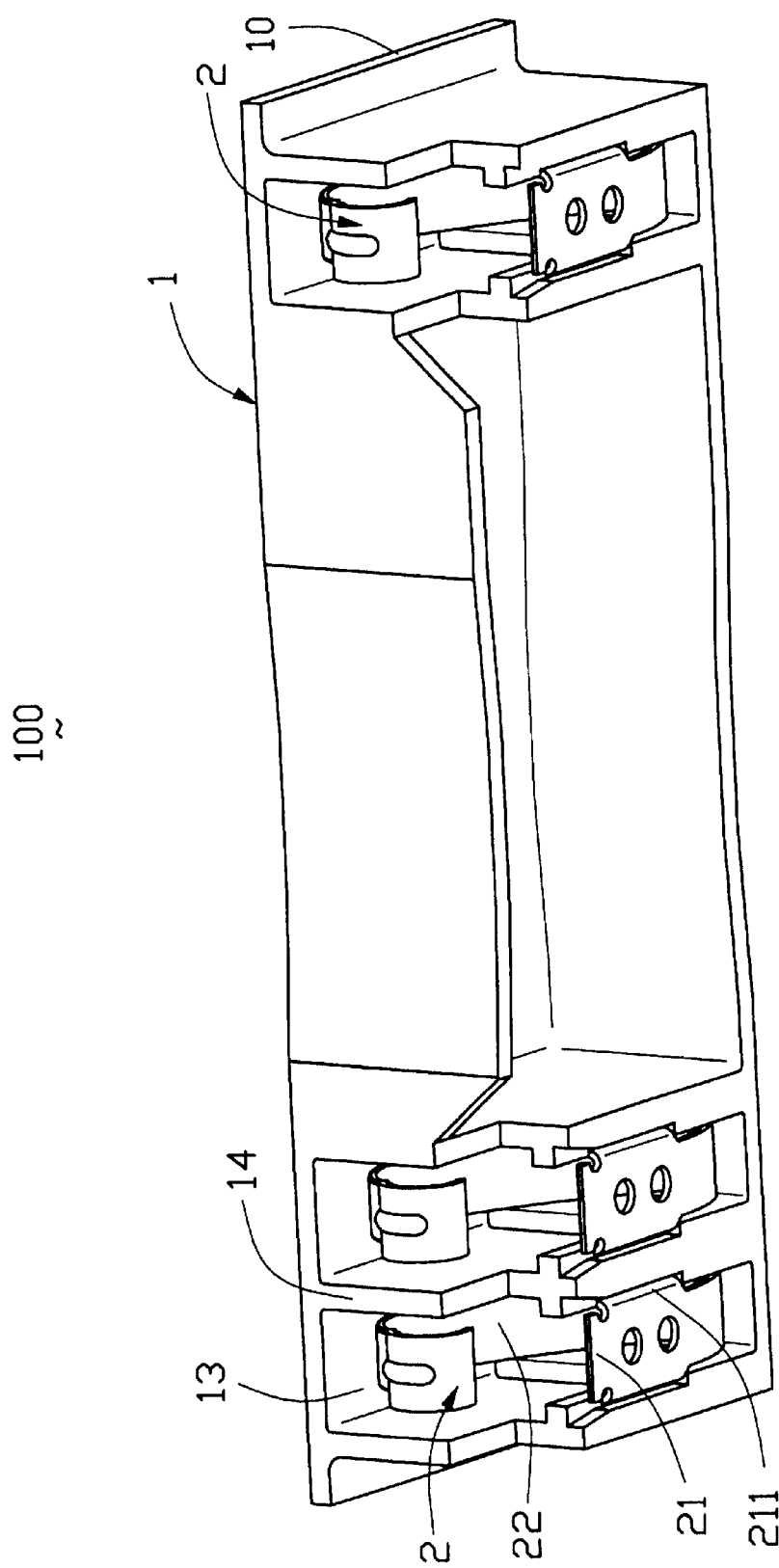
FIG. 3 is an assembled view of the locating means assembly of FIG. 1.
Figure 4:
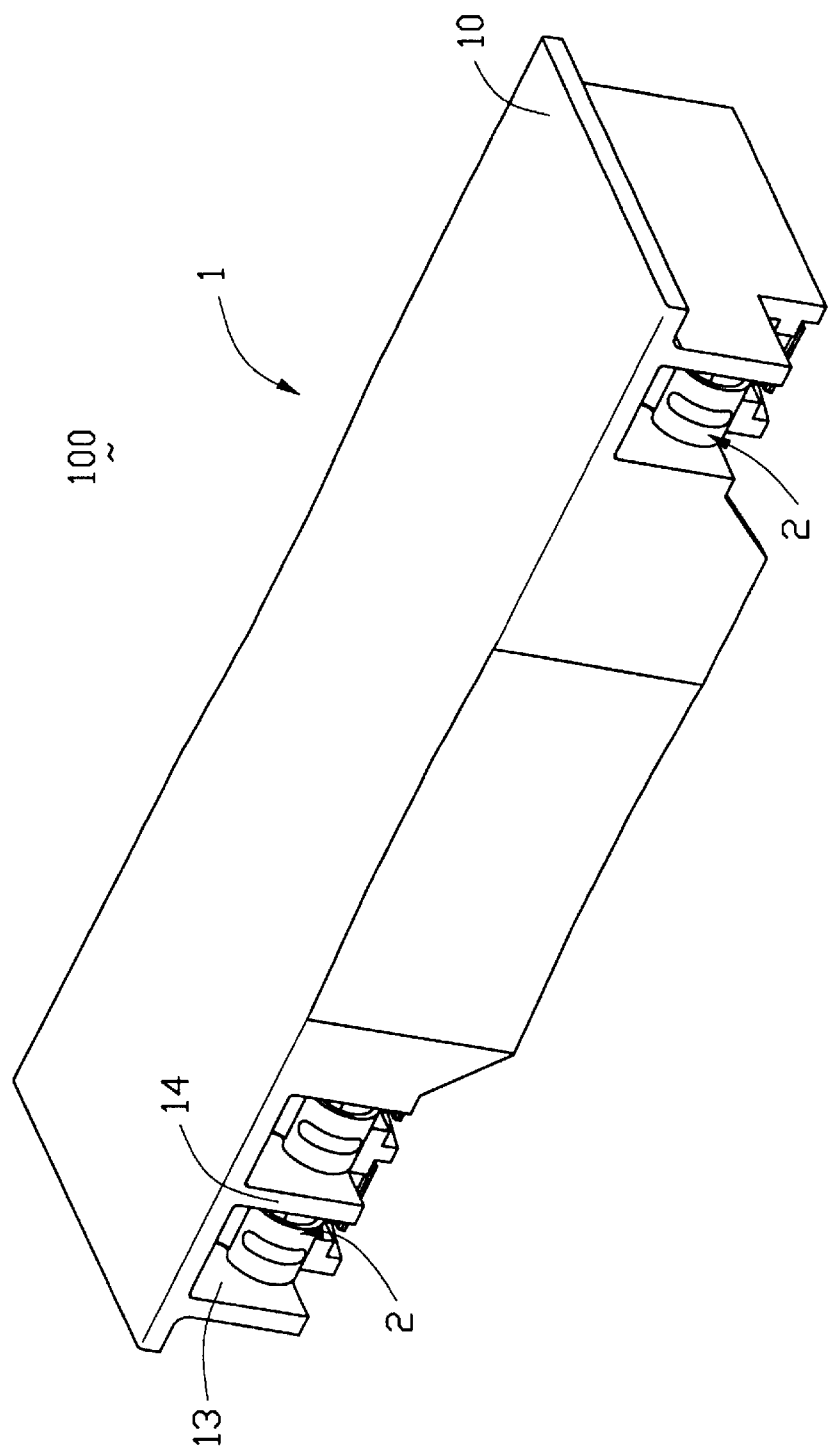
FIG. 4 is another assembled view of the locating means assembly of FIG. 1.

Referring to FIGS. 3 and 4, in assembly, the plurality of terminals 2 are installed in corresponding passageways 13 from a front surface of the housing 1, with respective soldering portions 21 held between the sidewalls 14, and respective fins 211 elastically engaging in the grooves 11 and held by the ribs 12 and the stopping portion 111. Thus, the terminals 2 are momentarily and slightly received in the housing 1. After the housing 1 with the terminals 2 is picked up and placed on a desired position of a printed circuit board (PCB) (not shown), the terminals 2 are correspondingly soldered to the PCB, then the housing 1 is removed from the PCB to separate from the terminals 2 and the terminals 2 are left on the PCB. The structure and number of the passageways 13 can be adjusted according to different terminals.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A terminal locating means assembly comprising:
  a housing having a top wall, a rear wall and a pair of side walls, and defining a passageway therein, a pair of ribs respectively protruding inwardly from lower portions of the two side walls and defining a pair grooves; and
  a conductive terminal having a planar soldering portion, and a pair of fins extending and bending upwardly from two lateral sides of the soldering portion, respectively, wherein the terminal is received in the housing, the pair of fins elastically engaging in the two grooves, respectively, and after the housing with the terminal is picked up and placed on a printed circuit board (PCB), the terminal is soldered to the PCB, then the housing is removed from the PCB to separate from the terminal.

2. The terminal locating means assembly as claimed in claim 1, wherein each groove comprises an enlarged portion defined at a front end thereof and a stopping portion formed at a rear end thereof.

3. A method of soldering a plurality of conductive terminals on a printed circuit board, comprising the steps of:
  providing an insulative housing with a plurality inner sidewalls defining therebetween respectively a plurality of passageways substantially fully open to an exterior on both a front face and the bottom face of said housing;

installing a plurality of conductive terminals into the corresponding passageways, respectively, from the front face until said terminals reach final positions in the corresponding passageways, where each of said terminals is temporarily held by said corresponding sidewalls, respectively, with a solder portion exposed on said bottom face;

positioning said housing with the associated terminals on a printed circuit board and soldering said solder portions on the printed circuit board; and forcibly removing said housing from said printed circuit board and leaving the solder portions on the printed circuit board.

4. The method as claimed in claim 3, wherein in the last step the housing is moved upwardly.

5. A terminal holder assembly comprising:

an insulative housing including a plurality of juxtaposed inner side walls defining a plurality of passageways each between every adjacent two inner side walls, each of said passageways substantially fully open to an exterior on a front face and a bottom face of the housing;

a plurality of conductive terminals inserted into the corresponding passageways, respectively, from the front face, each of said terminals including a solder portion exposed on said bottom face; and means for temporarily holding each of the terminals in the corresponding passageway; said means includes a pair of ribs respectively protruding inwardly from lower portions of the two side walls and defining a pair grooves wherein each of said terminals is allowed to be withdrawn from the housing downwardly.

6. The assembly as claimed in claim 5, wherein said means is positioned around said solder portion.

* * * * *